United States Patent [19]

Kneip, Jr.

[11] 4,212,169
[45] Jul. 15, 1980

[54] CRYOSTAT FOR SUPERCONDUCTING NMR SPECTROMETER

[75] Inventor: George D. Kneip, Jr., Menlo Park, Calif.

[73] Assignee: Varian Associates, Inc., Palo Alto, Calif.

[21] Appl. No.: 879,292

[22] Filed: Feb. 21, 1978

[51] Int. Cl.² ............................................. F17C 7/02
[52] U.S. Cl. ................................... 62/45; 62/514 R; 250/261
[58] Field of Search ................. 62/45, 514 R; 250/261

[56] References Cited

U.S. PATENT DOCUMENTS

| | | | |
|---|---|---|---|
| 2,643,022 | 6/1953 | Cornell | 62/45 |
| 3,119,238 | 1/1964 | Chamberlain et al. | 62/45 |
| 3,358,468 | 12/1967 | Hawkins et al. | 62/45 |
| 3,364,687 | 1/1968 | Kolm | 62/45 |

*Primary Examiner*—Ronald C. Capossela
*Attorney, Agent, or Firm*—Stanley Z. Cole; Edward H. Berkowitz

[57] ABSTRACT

An improved cryostat for the superconducting magnet of an NMR spectrometer comprises a nested structure of isothermal shells surrounding a thermally conductive central reservoir of substantially spherical shape containing liquid helium in which the superconducting solenoid remains operational when only partially immersed. A radiation shield surrounding the central reservoir is cooled by the boil-off of escaping helium vapor. The radiation shield is enclosed within an isothermal shell maintained at the temperature of liquid nitrogen by thermal contact with a liquid nitrogen reservoir disposed above the region of the central reservoir and shielded therefrom by a wall of the isothermal shell. An outer radiation shield surrounds the liquid nitrogen reservoir and associated isothermal shell and the outer radiation shield is maintained at a temperatures of the order of 235° K. by vapor cooling from the boil-off of escaping nitrogen and helium. A hermitically sealed containment vessel forms the outer wall of the cryostat and provides a port for evacuating to a very low common pressure all the interior spaces between adjacent nested structures.

4 Claims, 4 Drawing Figures

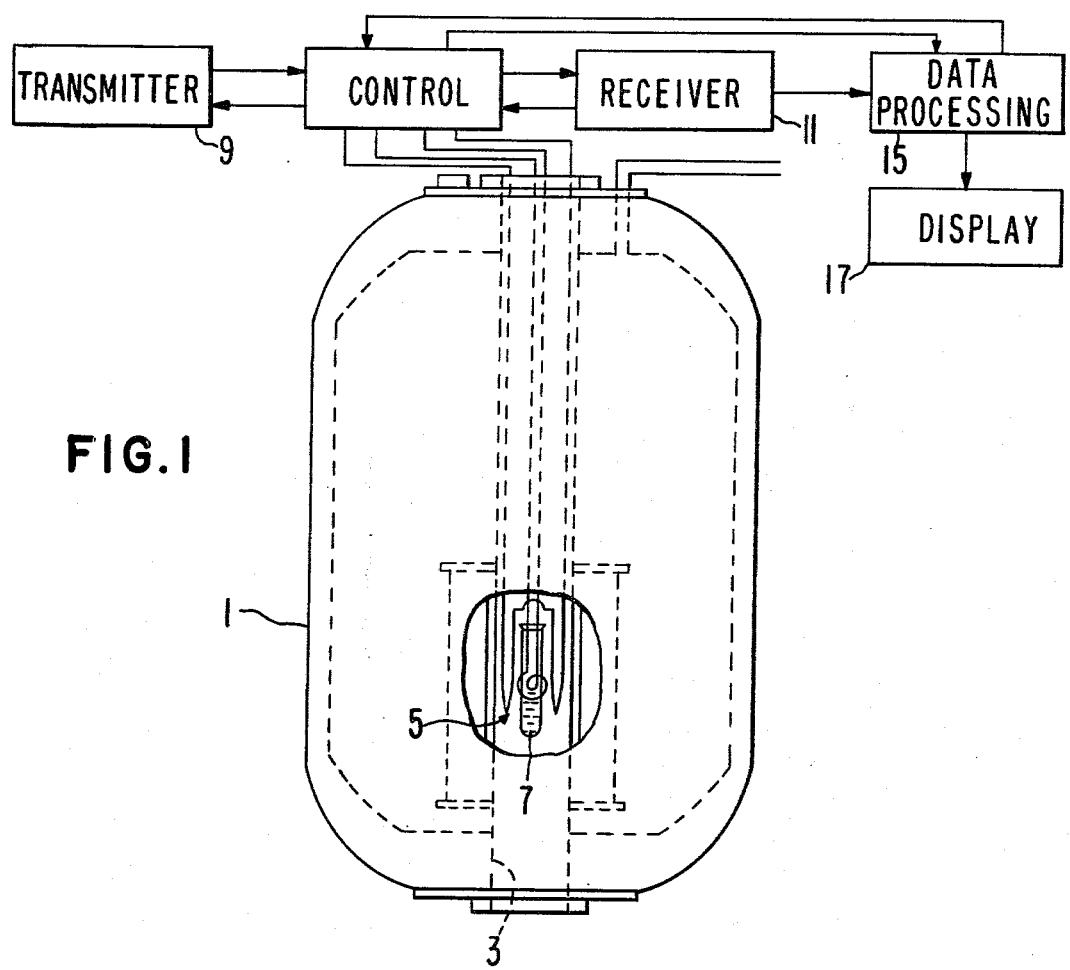
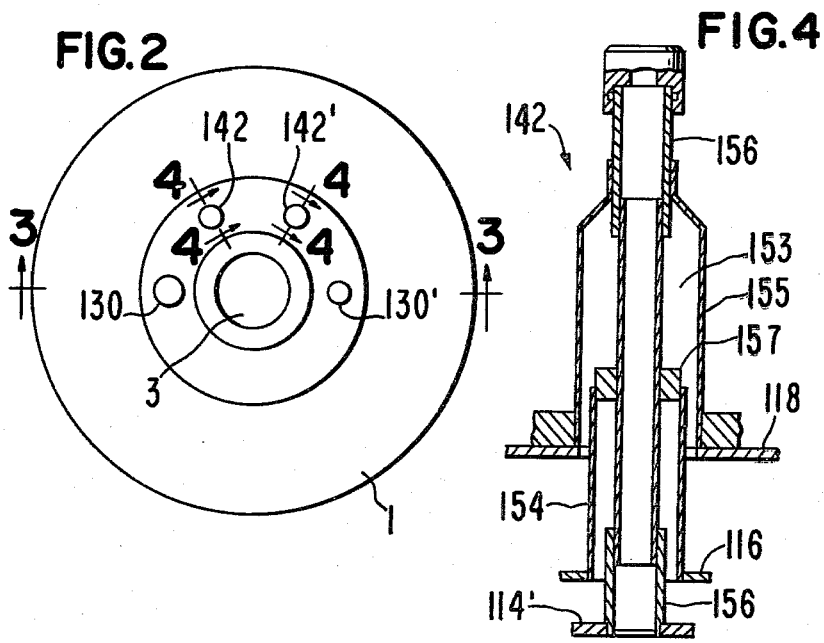

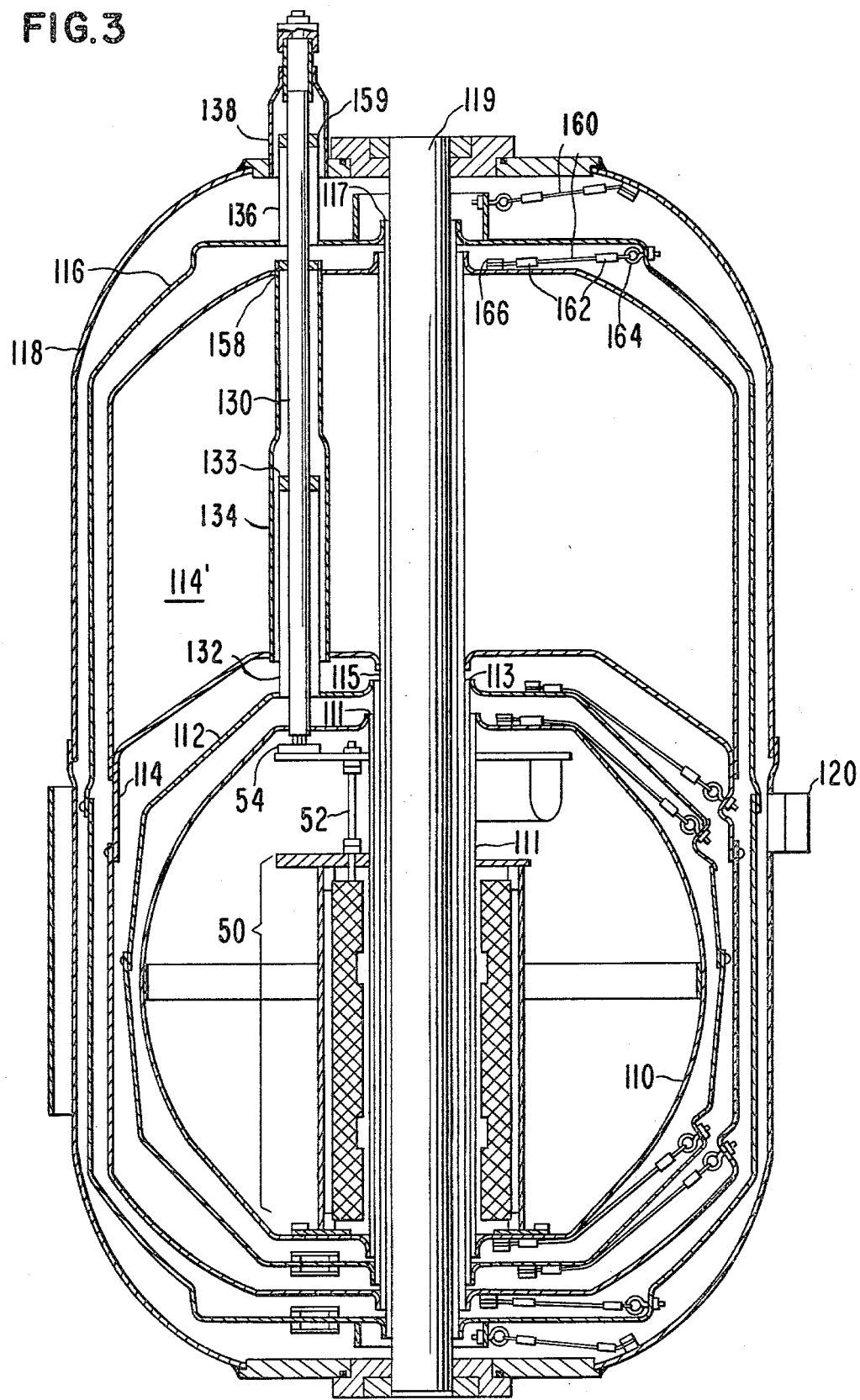

4,212,169

CRYOSTAT FOR SUPERCONDUCTING NMR SPECTROMETER

BACKGROUND OF INVENTION

This invention relates to cryostats for the containment of very low temperature liquids such as liquid helium and in particular to cryostats housing superconducting apparatus such as NMR spectrometer magnets.

Prior art cryostats for containment of superconducting apparatus, for example, superconducting magnets, have employed a helium vessel shaped to exhibit a relatively small cylindrical volume surrounding the superconducting magnet, in open communication with a larger volume disposed immediately above the solenoid. In this geometry the solenoid is maintained completely submerged in the liquid helium bath. A sufficient hold time for the liquid helium is provided by the head of liquid helium in the large volume. This form of helium reservoir exhibits a surface area to volume ratio substantially higher than the minimum achievable; consequently additional radiation losses are introduced which contribute to a higher rate of helium boil-off.

Prior art cryostats have taken the form of nested chambers which have been internally braced, as for example with stainless steel spokes, to withstand mechanical shock and to maintain minimum clearances between adjacent nested walls. Stainless steel has been a popular material of choice because of its relatively low thermal conductivity and its high strength. However, the thermal conductivity of such bracing places a limit upon the thermal isolation which can be achieved between adjacent surfaces of nested structures.

Cryostats of the prior art have employed a secondary temperature bath to shield the lowest temperature coolant from ambient temperature. Ordinarily, the secondary coolant reservoir is itself insulated from ambient temperature, as for example with layers of an insulating material. In a superconducting magnet with room temperature access, a relatively large magnet bore is required by prior art cryostat structures to provide sufficient space for this insulation. As a result, the inside diameter of such prior art solenoid is constrained to span a proportionately larger diameter to accomodate the additional insulation, whereby a much greater length of superconducting wire is required for fabrication of the solenoid.

BRIEF DESCRIPTION OF THE INVENTION

It is an object of the present invention to achieve an improved cryostat for the containment of a liquified gas whereby the loss of such liquified gas from a cryostat due to the boiling of such liquified gas is minimized.

It is another object of the present invention to minimize the amount of liquid helium required for operation of a superconducting magnet and to maximize the interval between replenishments of the liquid helium.

In one feature of this invention a substantially spherical central vessel is provided to contain the liquified gas forming a primary coolant, whereby the ratio of surface area to volume of such vessel is minimized.

In another feature of this invention the central vessel is constructed of aluminum of such thickness that the thermal gradient introduced by the finite thermal conductivity of the necessary fill and vent tubes leading from the central vessel, is still small enough to permit operation of superconducting apparatus only partly submerged in the liquified gas.

In yet another feature of the invention the central coolant reservoir is surrounded by a radiation shield spaced from the central reservoir and maintained at a first intermediate temperature through vapor cooling provided by the boil-off from the liquified gas contained in the central reservoir.

In yet another feature of this invention, the central reservoir and its surrounding radiation shield are enclosed by an isothermal surface defined by a second surrounding chamber and a second reservoir is provided externally above the second surrounding chamber, and in thermal contact with the outer surface of the second chamber, whereby the second chamber and reservoir form an isothermal body maintained at the temperature of a second liquified gas comprising the secondary coolant filling the second reservoir.

In still another feature of the invention an outer radiation shield is provided, enclosing the isothermal body comprising the second reservoir and the second chamber in contact therewith, such outer radiation shield maintained at a temperature intermediate the second coolant and ambient temperature.

In yet again another feature of the invention the outer radiation shield is maintained at the desired temperature by heat transfer to escaping vapor from the boil-off of at least one of said liquified gases.

In again another feature of the invention a hermetically sealed containment vessel encloses the nested structure formed by the outer radiation shield, the secondary coolant cooled isothermal surface, the inner radiation shield and the central reservoir, and the spaces between these nested structures communicate whereby such spaces may be evacuated in common.

In the present invention the primary coolant (hereafter, liquid helium) is contained in a central reservoir having a substantially spherical shape. The central reservoir is formed of aluminum and has a bore through its center defined by an aluminum cylindrical wall welded to the quasi-spherical reservoir. A superconducting solenoid is disposed within the central reservoir coaxial with the bore. In the present invention the surface to volume ratio is minimized, reducing the area of the central reservoir for absorption of heat by radiation and permitting operation of the solenoid to continue when the level of liquid helium falls substantially below the top of the solenoid.

A radiation shield surrounding the helium reservoir is provided to establish a first isothermal surface intermediate the central reservoir and a surrounding second isothermal surface, the latter maintained at the temperature of a secondary coolant (hereinafter, liquid nitrogen). The radiation shield is maintained at about 50° K through vapor cooling affected by the helium boil-off escaping up the fill and vent tubes with which the radiation shield is in thermal contact.

Surrounding the radiation shield and partially surrounding the fill and vent tubes, there is provided a secondary isothermal shell cooled by thermal contact with a liquid nitrogen reservoir disposed external the shell, above the region of the central reservoir. In this geometry the vent and fill tube from the central reservoir (partially surrounded by a cylindrical portion of the secondary isothermal shell) passes through a greater length of the secondary coolant reservoir as compared to prior art cryostats with consequently improved thermal isolation for the liquid helium reservoir.

The thermal isolation from ambient temperature of the secondary coolant reservoir and associated secondary isothermal shell is further improved in the present invention by provision of an outer radiation shield surrounding the secondary coolant reservoir and associated isothermal chamber. This outer radiation shield is maintained at a temperature intermediate the secondary coolant and ambient temperature by means of heat transfer from the outer radiation shield to vapor from boil-off of the liquified gases escaping through their respective fill and vent tubes.

An outer hermetically sealed vessel encloses the outer radiation shield and the interior of the cryostat permitting the spaces between adjacent nested surfaces to be evacuated to a pressure of the order of $10^{-6}$ torr. In this way gas conduction and convection mechanisms are minimized for heat transport to the central reservoir.

The present invention virtually eliminates direct conduction losses between nested structures due to the mechanical support and internal bracing by replacing the bracing spokes of the prior art with bracing formed of polyester cord. This feature is discussed in greater detail in copending U.S. patent application Ser. No. 879,289 assigned to the assignee of the present invention.

All of the walls forming the nested structure of the cryostat are constructed of aluminum, save for the fill and vent tubes of both the liquid nitrogen and helium reservoirs. The aluminum surfaces are subject to a treatment which reduces radiant emissivity of the surface. Consequently, heat transport by radiation is further reduced between adjacent surfaces. This feature is the subject of copending U.S. patent application Ser. No. 879,290 assigned to the assignee of the present invention.

Other features and advantages of the present invention will become apparent upon a perusal of the following specifications taken in connection with the accompanying drawings:

BRIEF DESCRIPTION OF THE DRAWINGS

FIG. 1 is a schematic of an NMR spectrometer system incorporating the present invention.

FIG. 2 is a top view of the cryostat of the preferred embodiment.

FIG. 3 is a section through the cryostat of FIG. 2.

FIG. 4 is a detail of the section of FIG. 2.

DESCRIPTION OF PREFERRED EMBODIMENT

A superconducting NMR spectrometer system employs a cryostat 1 having room temperature access to the magnetic field created within the cryostat 1 in a manner more explicitly depicted below. A probe 5 containing a sample 7 is introduced through bore 3 for analysis. A transmitter 9, receiver 11 and control unit 13, data processing unit 15 and display means 17 form the complete spectrometer (exclusive of power supplying systems for initiating persistent currents for the magnet).

FIG. 2 is a top view of the preferred embodiment of the cryostat 1 of this invention. A bore 3 provides room temperature access to the magnetic field created by apparatus within cryostat 1 as described below.

Turning now to FIG. 3, the cryostat 1 contains a superconducting solenoid assembly 50 within a central reservoir 110. Reservoir 110 contains a primary coolant, preferably liquid helium, to maintain the superconducting state of the windings comprising solenoid assembly 50. Leads from the solenoid windings, collectively denoted 52 terminate in a connector 54 for access to external current sources introduced in a manner to be described. Additional circuits comprising persistence switches for controlling transitions between the normal and superconducting state for selected windings are not shown. These circuits and preferred persistence switches are further described in, and form the subject matter of respective copending U.S. patent application Ser. Nos. 879,293 and 879,294 assigned to the assignees of the present invention. The solenoid assembly 50 is not within the scope of the present invention and is further described in copending application Ser. Nos. 879,298 and 879,291, both assigned to the assignee of the present invention.

Central coolant reservoir 110 is formed from 0.125" aluminum to a substantially spherical shape as shown, by spinning techniques well known in the art. In the preferred embodiment, reservoir 110 has a coolant capacity of about 25 liters. Reservoir 110 is further characterized by a bore formed by cylindrical wall 111, welded to reservoir 110. Room temperature access is thereby afforded to the magnetic field of solenoid assembly 50. Reservoir 110 is isolated from ambient temperature by means of a plurality of consecutively nested surrounding chambers 112, 114, 116, and 118 having coaxial bores defined by cylindrical tubes 113, 115, 117, and 119, respectively. The wall thickness of each of the respective cylindrical coaxial tubes is determined by the heat load on each and varies from 0.02" to 0.049". The spaces between chambers 112, 114, 116, and 118 are mutually communicating in a manner described below and evacuated through pump-out port 120 in exterior chamber 118 to achieve a very low pressure, as for example $10^{-6}$ torr to minimize thermal conduction between adjacent nested surfaces through gas conductivity and convection.

A secondary coolant reservoir 114', is disposed above central reservoir 110 and in thermal contact with chamber 114 whereby chamber 114, preferably formed of nominal 0.190" aluminum, comprises a shell at the temperature of the secondary coolant, preferably liquid nitrogen.

Returning to FIG. 2, two vent and fill tubes 130 and 130' are required for access to the central reservoir. These are constructed of ⅜" I.D. stainless steel having a wall thickness of 0.005". Two such vent and fill tubes 130 and 130' appear in FIG. 1 and one such structure is disclosed in greater detail in FIG. 3. These vent and fill structures differ only in that electrical connector 54 is required only for tube 130. Tube 130 (and 130') is preferably of stainless steel in order to minimize thermal conductivity from the liquid helium reservoir to the exterior of the cryostat. Tube 130 is shielded by coaxial tubes 132, 134, 136, and 138, each of which form part of the respective nested chambers 112, 114, 116, and 118. Thermal transfer collar 133 (and 133', not shown), preferably of aluminum, serves to transfer heat to the boil-off helium vapor passing through tube 130 (and 130'), thereby to maintain isothermal shell 112 at a fixed temperature.

Radiation shield 112 is preferably constructed of aluminum by conventional spinning techniques and defines an isothermal shell of temperature intermediate the secondary coolant (liquid nitrogen at 77.4° K.) and the primary coolant (liquid helium at 4.2° K.). For liquid nitrogen-liquid helium combinations the temperature of the radiation shield 112 is optimized at about 50° K. Heat is transferred to the radiation shield principally by radiation (and by conduction through mechanical bracing means described below) from the interior of surrounding shell 114 and heat is transferred from the radiation shield 112 to the helium vapor in the fill and vent tubes 130 and 130' through aluminum contact collars 133 and 133' respectively, welded to fill and vent tubes 130 and 130' and to radiaton shield 112. Thermal contact between tubes 130 and 130' and their respective collars 133 and 133' occurs at a point where approximately 10 mw. of thermal power is supplied to the escaping helium vapor from radiation shield 112.

Radiation shield 112 is nested within surrounding isothermal shell 114 which is maintained at liquid nitrogen temperature by welded contact with liquid nitrogen reservoir 114'. The outer surface of isothermal body 114–114' is itself shielded by outer radiation shield 116 which is maintained at a temperature intermediate that of liquid nitrogen and room temperature in a manner described more fully below.

Hermetically sealed external vessel 118 encloses the cryostat structure and provides external mechanical and vacuum integrity.

Baffled apertures 135 and 137 are provided in radiation shields 112 and 116 as shown. A similar baffled aperture in shell 114, not visible in the section of FIG. 2, provides communication between all interior spaces of the nested structure whereby these interior spaces are maintained at a common pressure by evacuation through port 120.

The liquid nitrogen reservoir 114' and associated shell 114 are effectively insulated by cooling outer radiation shield 116 to a temperature intermediate that of liquid nitrogen and ambient temperature. Maintaining radiation shield 116 at preferably 235° K. is accomplished by providing a heat exchange to the escaping helium and nitrogen vapors in a manner similar to that of the inner radiation shield.

FIG. 4 is a section through one of two liquid nitrogen vent and fill tubes 142 and 142'. A thermally non-conductive central fill tube 153, preferrably of stainless steel tubing, 0.005 inches in wall thickness, supports a thermal gradient between the 77° K. temperature of liquid nitrogen reservoir 114' and ambient temperature over a distance of about 4¼". This tube is shielded by concentric tubes 154 and 155, respectively, the nitrogen fill tube shield portions of outer radiation shield 116 and containment vessel 118. Aluminum end contact tubes 156, brazed to central fill tube 153 provide strength and a surface for welding further to reservoir 114' and outside shield tube 155. A thermally conductive collar 157 contacts the central nitrogen fill tube 153 at a point along the thermal gradient where the heat transfer from outer radiation shield 116 to liquid nitrogen escaping up the central fill tube 153 is sufficient to maintain the outer radiation shield 116 at a desired temperature intermediate the temperature of liquid nitrogen and ambient temperature. In similar fashion, helium fill and vent tube 130 (see FIG. 3) is thermally joined to liquid nitrogen reservoir 114' through heat transfer collar 158 and at a point along the thermal gradient of tube 130 another thermal collar 159 provides a heat transfer path from outer radiation shield 116 to the vapor escaping up tube 130. The temperature of the thermal contact point of collar 159 is selected to be substantially equal to that of collar 157 on the nitrogen fill and vent tube 153. A second helium fill and vent tube 130' not shown provides another thermal contact point, the details of which do not differ from that shown and described above. In this fashion, outer radiation shield 116 is vapor cooled in exact analogy to the cooling of radiation shield 112 as described previously.

The central reservoir 110, radiation shield 112, liquid nitrogen reservoir 114' and shell 114, outer radiation shield 116 and containment vessel 118 are fabricated from an aluminum alloy, preferably alloy 1100-0. This alloy is well-known and commercially available from several manufacturers. After the above-listed bodies have been formed by spinning, the interior adjacent facing surfaces of the respective bodies are polished and subject to a surface treatment technique which lowers the emissivity of these surfaces by 35%. In this manner, heat transport by radiation to the liquid helium central reservoir is drastically reduced. The technique by which the emissivity characteristics are modified form the subject of copending U.S. patent application Ser. No. 879,290 assigned to the assignee of the present invention.

The nested structure of a cryostat such as exhibited by the present invention requires an internal mechanical support to maintain the centering of the various shells, and the coaxial alignments and close tolerances therebetween. It is important that the coaxial tubes 111, 113, 115, 117 and 119 forming the bore for room temperature access be precisely located. It is equally important to constrain the nested structure during shipment of the apparatus because the thermal-mechanical specifications of certain components result in a measure of mechanical fragility. It is clear that any mechanical constraint linking adjacent structures must perforce result in a conductive path for heat transport; consequently, a very low thermal conductivity is essential. Moreover, high strength is essential to provide the required mechanical constraints. Braided polyester cord has been found to be an ideal material for this purpose, notwithstanding the precision required for alignment of the components of the cryostat.

Returning to FIG. 3, it will be perceived that adjacent members of the nested structures 110, 112, 114 and 114', 116 and 118 are subject to constraints through polyester cord centering spokes. In the interest of clarity only a representative spoke 160 is described in detail. The spoke itself is formed of polyester cord, preferably of braided Dacron. The strength and thermal conductivity parameter of this material are known and exhibit the highest known ratio of strength to thermal conductivity. The polyester material which has been employed in the preferred embodiment is supplied as 190 2 Corsair DB by Rocky Mount Cord Company of Rocky Mount, N.C. A loop is formed at each end secured to the running length of the cord by aluminum sleeves 162. One of the loops formed thereby is affixed to an eyebolt 164 secured to one of the adjacent pairs of shells and the other loop engages a snubbing post 166 welded to the other adjacent shell. These polyester spokes are disposed at regular intervals for example 120° about the axis of bore 3.

The representative spacing between adjacent coaxial bore tubes 111–113, 113–115, 115–117, and 117–119 range from 0.178" to 0.16" for the widest and most narrowly spaced of the aforementioned bore tube pairs; it is desired to maintain these bore tubes mounted coaxial with one another and with solenoid assembly 50 to a precision substantially better than 0.03". This has been accomplished with the aforementioned polyester spokes with resulting additional improvement in the shipping properties of the apparatus at room temperature. Stainless steel spokes properly dimensioned for operating conditions in the liquid helium-liquid nitrogen temperature range are under substantial tensile stresses at room temperature. Such rigid spokes which would exhibit thermal conductance comparable to the spokes of the present invention are known to be highly susceptible to failure due to shock and vibration. In contrast, the polyester tensile loaded spokes of the present invention exhibit a degree of stretch at room temperature during shipment. The bore tubes are thereby permitted to touch when subject to lateral shock and vibration. For shipment purposes, a mandrel slip fit to the central bore, prevents permanent deformation of the several coaxial bore tubes in collision.

Precise location of the components is facilitated by the behaviour of the coefficient of expansion of the spoke material of the present invention in the temperature range from liquid helium to ambient. As a result of the present invention, it has been found that the coefficient of expansion of the subject material which is normal in behaviour to about $-25°$ C. anomalously changes sign and the material expands as the temperature is further reduced. A very low net thermal expansion is thereby obtained for this material.

The cryostat of the preferred embodiment achieves very substantial improvement over the prior art in consumption of the coolants. For example, the liquid helium boil-off rate measured for one prior art cryostat amounts to 30 cc/hr whereas the preferred embodiment of the instant invention exhibits a measured boil-off rate of about 6 cc/hr. The low boil-off rate conjoined with the geometry of the central reservoir 110 yields an extended mean time between replenishment of liquid helium of about 120 days, wherein about 20.5 liters of liquid helium are consumed. A superconducting NMR spectrometer having a magnet of comparable characteristics requires liquid helium replenishment at intervals of 8 days and consumes about 86.4 liters of liquid helium in the same 120 day period.

The extended mean time between filling of the central reservoir 110 is achieved in part because the central reservoir 110 has a substantially spherical shape. In the present invention the central reservoir 110 is fabricated of aluminum of sufficiently heavy gauge that the thermal gradient from top to bottom of the central reservoir (due to heat conducted down fill and vent tubes 130 and 130' and radiation from shield 112) is so reduced that the reservoir 110 is isothermal independent of the level of liquid helium contained therein. It has been found that in this reservoir the liquid helium level can be allowed to drop well below the top of the superconducting solenoid without adverse effect upon the operation of the solenoid. The solenoid assembly 50, having a length of about 10 inches, has been operated satisfactorily with liquid helium level reduced to about 3 inches in the reservoir 110 exposing about 7 inches of the solenoid assembly 50.

For the liquid nitrogen coolant the rate of consumption is also reduced and the mean interval between replenishment extended. The liquid nitrogen boil-off rate is measured at about 80 cc/hour with the outer radiation shield cooled to 235° K. The outer radiation shield cooled to the above preferred temperature reduces the thermal transfer by radiation to the liquid nitrogen reservoir 114' by approximately 88% in comparison with an unshielded reservoir. This is a consequence of the Stefan-Boltzmann radiation law which states that the energy radiated (or absorbed) in unit time by an emissive body is proportional to the difference in the fourth powers of the absolute temperatures of the radiating (absorbing) body and that of its surroundings.

The cryostat of the present invention has been described particularly in terms of a liquid nitrogen shielded, liquid helium cooled superconducting magnet for an NMR spectrometer. The inventive contributions to cryostat design disclosed herein transcend the specific application and employment of particular coolants. These inventive contributions may be directed to cryostats housing apparatus used for applying a variety of low temperature phenomena and to other superconductive devices.

Since many changes can be made in the above construction and many apparently widely differing embodiments of this invention could be made without departing from the scope thereof, is intended that all matter contained in the above-description and shown in the encompanying drawing shall be interpreted as illustrative and not in a limiting sense.

What is claimed is:

1. In a cryostat for a superconducting NMR spectrometer,
   a substantially spherical central reservoir adapted to contain a first liquified gas,
   a superconductive solenoid housed within said central reservoir, and
   means for venting said central reservoir to the exterior of said cryostat,
   first radiation shield means surrounding said substantially spherical reservoir and partially surrounding said venting means,
   shell means surrounding said first radiation shield and partially surrounding said venting means and a second reservoir for containing a second liquified gas, said second reservoir disposed in thermal contact with said shell in the region above said central reservoir, whereby said shell and said reservoir form an isothermal body at the temperature of said second liquified gas,
   said first radiation shield further comprising a thermally conductive means contacting said venting tube at a point intermediate along the length of said tube, whereby said radiation shield is cooled to a selected temperature by the vapor of said first liquified gas escaping through said vent tube, said selected temperature intermediate the temperature of said liquified gas and the temperature of the external surrounds of said first radiation shield,
   an outer radiation shield surrounding said isothermal body and partially surrounding said venting means, said outer radiation shield further comprising a thermally conductive means contacting said venting means tube whereby said outer radiation shield is maintained at a temperature intermediate said second liquified gas and ambient temperature by the vapor of said first liquified gas escaping through said vent tube, and
   a hermetically sealed containment vessel surrounding said outer radiation shield and partially surrounding said venting means.

2. The apparatus of claim 1 wherein said containment vessel, said outer radiation shield, said shell means and second reservoir, said first radiation shield and said central reservoir are characterized by mutually coaxial bores defining a region accessible from the exterior of said cryostat.

3. The apparatus of claim 1 wherein said first liquified gas is helium.

4. The apparatus of claim 1 or 3 wherein said second liquified gas is nitrogen.

* * * * *